(12) United States Patent
Tanaka

(10) Patent No.: US 11,552,341 B2
(45) Date of Patent: Jan. 10, 2023

(54) METHOD FOR INSPECTING A SECONDARY BATTERY

(71) Applicant: Prime Planet Energy & Solutions, Inc., Tokyo (JP)

(72) Inventor: Ruri Tanaka, Toyota (JP)

(73) Assignee: PRIME PLANET ENERGY & SOLUTIONS, INC., Tokyo (JP)

(*) Notice: Subject to any disclaimer, the term of this patent is extended or adjusted under 35 U.S.C. 154(b) by 0 days.

(21) Appl. No.: 17/408,494

(22) Filed: Aug. 23, 2021

(65) Prior Publication Data

US 2022/0085426 A1 Mar. 17, 2022

(30) Foreign Application Priority Data

Sep. 15, 2020 (JP) .............................. JP2020-154677

(51) Int. Cl.
*H01M 10/44* (2006.01)
*G01R 31/396* (2019.01)
*H02J 7/00* (2006.01)
*H01M 10/63* (2014.01)
*H01M 10/48* (2006.01)
*H01M 10/42* (2006.01)

(52) U.S. Cl.
CPC ........ *H01M 10/443* (2013.01); *G01R 31/396* (2019.01); *H01M 10/4285* (2013.01); *H01M 10/48* (2013.01); *H01M 10/63* (2015.04); *H02J 7/0047* (2013.01)

(58) Field of Classification Search
CPC ............... H01M 10/443; H01M 10/63; H01M 10/4285; H01M 10/48; G01R 31/396; H02J 7/0047

USPC ...... 324/425–434, 444–450, 76.11, 500, 600
See application file for complete search history.

(56) References Cited

U.S. PATENT DOCUMENTS

| | | |
|---|---|---|
| 2013/0164579 A1 | 6/2013 | Harii et al. |
| 2015/0295431 A1* | 10/2015 | Honda ................ H02J 7/0021 320/152 |
| 2018/0164363 A1 | 6/2018 | Brorein et al. |
| 2019/0041466 A1 | 2/2019 | Goto et al. |
| 2019/0198942 A1 | 6/2019 | Kobayashi et al. |
| 2020/0067147 A1* | 2/2020 | Goto .................... G01R 31/385 |

FOREIGN PATENT DOCUMENTS

| | | |
|---|---|---|
| JP | 201581887 A | 4/2015 |
| JP | 201896960 A | 6/2018 |
| JP | 2018190688 A | 11/2018 |
| JP | 201932198 A | 2/2019 |
| JP | 201974363 A | 5/2019 |
| JP | 2019113450 A | 7/2019 |
| WO | 2012026105 A1 | 3/2012 |

* cited by examiner

*Primary Examiner* — Melissa J Koval
*Assistant Examiner* — Trung Q Nguyen
(74) *Attorney, Agent, or Firm* — Hauptman Ham, LLP

(57) ABSTRACT

An inspection method for a secondary battery includes: constituting a circuit by connecting a charged secondary battery to a power supply; measuring a circuit current flowing through the circuit in association with self-discharge of the secondary battery; and determining the quality of the secondary battery based on a measured value of the circuit current converged in the measuring. During execution of the measuring, a battery temperature control is performed to control the temperature of the secondary battery.

4 Claims, 8 Drawing Sheets

METHOD FOR INSPECTING A SECONDARY BATTERY

CROSS-REFERENCE TO RELATED APPLICATIONS

This application is based upon and claims the benefit of priority to Japanese Patent Application No. 2020-154677 filed on Sep. 15, 2020, the entire contents of which are incorporated herein by reference.

BACKGROUND

Technical Field

This disclosure relates to a method for inspecting a secondary battery.

Related Art

Japanese unexamined patent application publications Nos. 2019-032198 and 2019-113450 disclose an inspection method for a secondary battery, in which a power supply is connected to a secondary battery to be inspected, i.e., a target secondary battery for inspection, to constitute a circuit and then the quality of the secondary battery is determined based on the electric current flowing through the circuit. This inspection method includes a circuit constitution process of constituting the circuit with a charged secondary battery and a power supply, a current measurement process of measuring a circuit current flowing through the circuit in association with self-discharge of the secondary battery, and a determination process of determining the quality of the secondary battery based on a value of the circuit current after convergence (referred to as a converged circuit current) that is measured in the current measurement process.

In the above-described inspection method, the amount of self-discharge of a secondary battery is inspected. When the self-discharge amount is large, the secondary battery is defective, whereas when the self-discharge amount is small, the secondary battery is non-defective. Specifically, the battery voltage of the target secondary battery for inspection is firstly measured. In the circuit constitution process, the power supply that is equal in voltage to the secondary battery is connected to this secondary battery to constitute an inspection circuit. Then, the battery voltage decreases because of self-discharge of the secondary battery, generating a voltage difference between the voltage of the secondary battery (battery voltage) and the voltage of the power supply (power-supply voltage). Accordingly, a circuit current starts to flow through the inspection circuit.

This circuit current increases with the passage of time and thereafter the circuit current becomes equal to a leakage current (a self-discharge current) that flows through the battery and causes the self-discharge of the secondary battery, so that the circuit current converges, that is, comes into a steady state. Accordingly, measuring the converged circuit current enables acquisition of the amount of self-discharge of a secondary battery (the self-discharge current). After measurement of the converged circuit current, a measured value of the converged circuit current and a preset threshold are compared in the determination process. When the measured value is larger than the threshold, the target secondary battery for inspection is determined as a defective product with a large self-discharge amount, whereas when the measured value is the threshold or less, the target secondary battery for inspection is determined as a non-defective product with a small self-discharge amount.

SUMMARY

Technical Problems

Meanwhile, in the foregoing inspection method, after the circuit is constituted in the circuit constitution process, the temperature of the target secondary battery for inspection may fluctuate as the room temperature of an inspection room fluctuates. To be specific, even when a set temperature of an air conditioner for adjusting the room temperature of the inspection room is set to a predetermined temperature, it is hard to make the room temperature constant and thus the room temperature continuously fluctuates during the inspection period. For this reason, the temperature of the target secondary battery for inspection fluctuates with the fluctuations in the room temperature of the inspection room during the inspection period.

In some cases, the fluctuations in the battery temperature may cause the battery voltage to fluctuate, that is, the battery voltage fluctuates because of a different factor from the self-discharge of the secondary battery, so that the circuit current fluctuates. Consequently, the circuit current is hard to converge and therefore the quality of the secondary battery could not be determined appropriately.

The present disclosure has been made to address the above problems and has a purpose to provide a method for inspecting a secondary battery, in which a circuit current flowing through a circuit in association with self-discharge of the secondary battery is easy to converge.

Means of Solving the Problems

To achieve the above-mentioned purpose, one aspect of the present disclosure provides a method for inspecting a secondary battery, wherein a circuit is constituted by connection of a power supply to the secondary battery to be inspected, and a quality of the secondary battery is determined based on a circuit current that flows through the circuit, the method including: constituting the circuit by connecting the power supply to the secondary battery that has been charged; measuring the circuit current that flows through the circuit in association with self-discharge of the secondary battery; and determining the quality of the secondary battery based on a value of the circuit current after convergence that is measured in the measuring, wherein during execution of the measuring, a battery temperature control is performed to control a temperature of the secondary battery.

In the foregoing inspection method, in the constituting, the secondary battery after charged and the power supply are connected to each other to constitute the circuit. The constituting may include for example constituting a circuit by connecting the secondary battery that has been charged, i.e., by connecting the secondary battery after the secondary battery is charged, to a power supply that is equal in voltage to the secondary battery so that the voltage of the power supply is opposite in direction to the voltage of the secondary battery. In the thus configured circuit, the battery voltage decreases in association with the self-discharge of the secondary battery and thus a voltage difference occurs between the voltage of the secondary battery (battery voltage) and the voltage of the power supply (power-supply voltage). This causes a current to flow through the circuit. In the measuring, therefore, the circuit current caused to flow through the circuit in association with the self-discharge of the secondary battery is measured. For instance, the circuit current value is measured at regular intervals from when the circuit is constituted. In the determining, furthermore, the quality of the secondary battery is determined, i.e., whether the secondary battery is defective or non-defective is determined, based on the circuit current after convergence that is measured in the measuring, e.g., the converged circuit current obtained in the measuring.

In the foregoing inspection method, furthermore, while the measuring is being performed, e.g., during a period from when the circuit is constituted to when the converged circuit current value is obtained, the battery temperature control is performed to control the temperature of the secondary battery to be inspected. As the battery temperature control, for example, the temperature of the secondary battery is controlled to coincide with the target temperature, e.g., the inside temperature of the inspection room in which the inspection is performed. Accordingly, the battery temperature fluctuations are reduced during execution of the measuring. This can reduce the battery voltage fluctuations due to the battery temperature fluctuations, that is, the battery voltage fluctuations caused by a different factor from the self-discharge of the secondary battery. Thus, the circuit current fluctuations resulting from the battery voltage fluctuations due to the battery temperature fluctuations can also be reduced. Consequently, the circuit current flowing through the circuit in association with the self-discharge of the secondary battery can easily converge and it is thus possible to appropriately determine the quality of the secondary battery, defective or non-defective.

Furthermore, the foregoing method the battery temperature control may include controlling the temperature of the secondary battery so that the temperature of the secondary battery becomes a target temperature.

In the above-described inspection method, the battery temperature control is configured to control the temperature of the secondary battery to bring the temperature of the secondary battery to the target temperature. This control can keep the battery temperature at the target temperature or a temperature close thereto, e.g., within a range of the target temperature ±0.1° C., during execution of the measuring. Accordingly, this method can minimize the battery voltage fluctuations resulting from the battery temperature fluctuations and thus facilitate convergence of the circuit current. To be specific, this method can converge the circuit current quickly and enables prompt determination of the quality of the secondary battery in the determining. The target temperature may include for example a room temperature (an actual measured value) of the inspection room obtained when the circuit is constituted.

In each of the foregoing inspection methods for a secondary battery, the secondary battery to be inspected may include a plurality of secondary batteries included in a battery stack in which the secondary batteries are arranged in a row and restrained in an arrangement direction, and the power supply comprises a plurality of power supplies, the constituting includes connecting each of the power supplies to one of the secondary batteries to constitute a plurality of the circuits, the measuring includes measuring the circuit current that flows through each of the circuits, the determining includes determining the quality of each of the secondary batteries based on a value of the circuit current after convergence, and the battery temperature control includes controlling the temperature of each of the secondary batteries so that the temperature of each secondary battery becomes the target temperature.

In the above-described inspection method, each of the secondary batteries of the battery stack is inspected. Specifically, in the constituting, the power supplies are individually connected to the secondary batteries of the battery stack to constitute the plurality of circuits as many as the target secondary batteries to be inspected. This constituting may be configured for example to constitute by individually connecting the secondary batteries of the battery stack to external power supplies each equal in voltage to the battery voltage of the corresponding secondary batteries so that the voltage of each external power supply is opposite in direction to the voltage of the secondary battery to constitute the plurality of circuits as many as the target secondary batteries for inspection. When those circuits are constituted, the battery voltage decreases in association with the self-discharge of each secondary battery, causing a current to flow through each circuit.

In the above-described inspection method, furthermore, the battery temperature control may be configured to individually control the temperatures of the secondary batteries so that the temperature of each secondary battery becomes the target temperature. In this control, for example, the temperatures of the secondary batteries are individually controlled by the plurality of the battery temperature controllers each provided for one of the secondary batteries of the battery stack, i.e., in the same number as the target secondary batteries to be inspected, so that the temperature of each secondary battery becomes the target temperature. While each of the circuits is being subjected to the measuring, the battery temperature of each secondary battery of the battery stack can be maintained at the target temperature or a temperature close thereto, e.g., within a range of the target temperature ±0.1° C.

Accordingly, this method can minimize the battery voltage fluctuations of each secondary battery of the battery stack resulting from the battery temperature fluctuations and thus further facilitating convergence of the circuit current. To be specific, this method can converge the circuit current quickly in each secondary battery of the battery stack and enables prompt determination of the quality of each secondary battery in the determining. Regarding the target temperature, all of the secondary batteries constituting the battery stack may be set with the same target temperature or alternatively all or some of the secondary batteries may be set with different target temperatures.

DETAILED DESCRIPTION OF THE EXEMPLARY EMBODIMENTS

A detailed description of a method for inspecting a secondary battery in an embodiment of this disclosure will now be given referring to the accompanying drawings. The inspection method in the present embodiment is performed in a state where a measuring device 2 having a DC power supply 4 is connected to a secondary battery 1 to be inspected, which is a target for inspection, to constitute a circuit 3. The details thereof will be described below.

Figure 2:
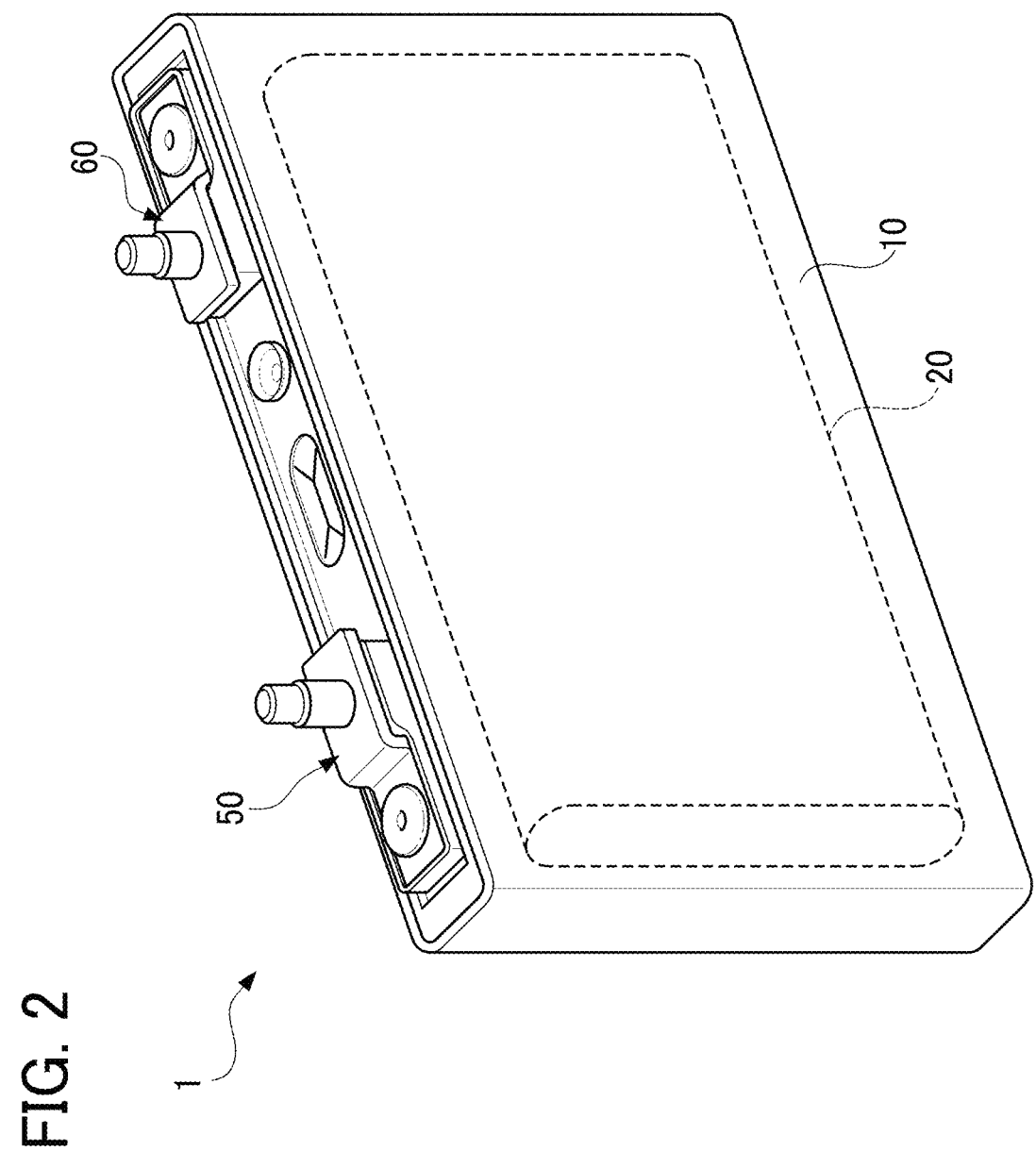
FIG. 2 is a perspective view of a target secondary battery for inspection.

The secondary battery 1 to be inspected will be first described below. The secondary battery 1 has an external appearance of a flat rectangular shape as shown in FIG. 2. This secondary battery 1 includes an outer casing 10 and an electrode laminated body 20 accommodated in this outer casing 10. The electrode laminated body 20 is a laminated body of positive electrode sheets (not shown) and negative electrode sheets (not shown) with separators (not shown) interposed therebetween. The outer casing 10 contains therein an electrolyte solution in addition to the electrode laminated body 20. Further, the outer casing 10 is provided, on its outer side, i.e., top surface, with a positive terminal 50 and a negative terminal 60. The secondary battery 1 to be inspected may have any outer shape, such as a cylindrical shape, not limited to the flat rectangular shape shown in FIG. 2.

Figure 1:
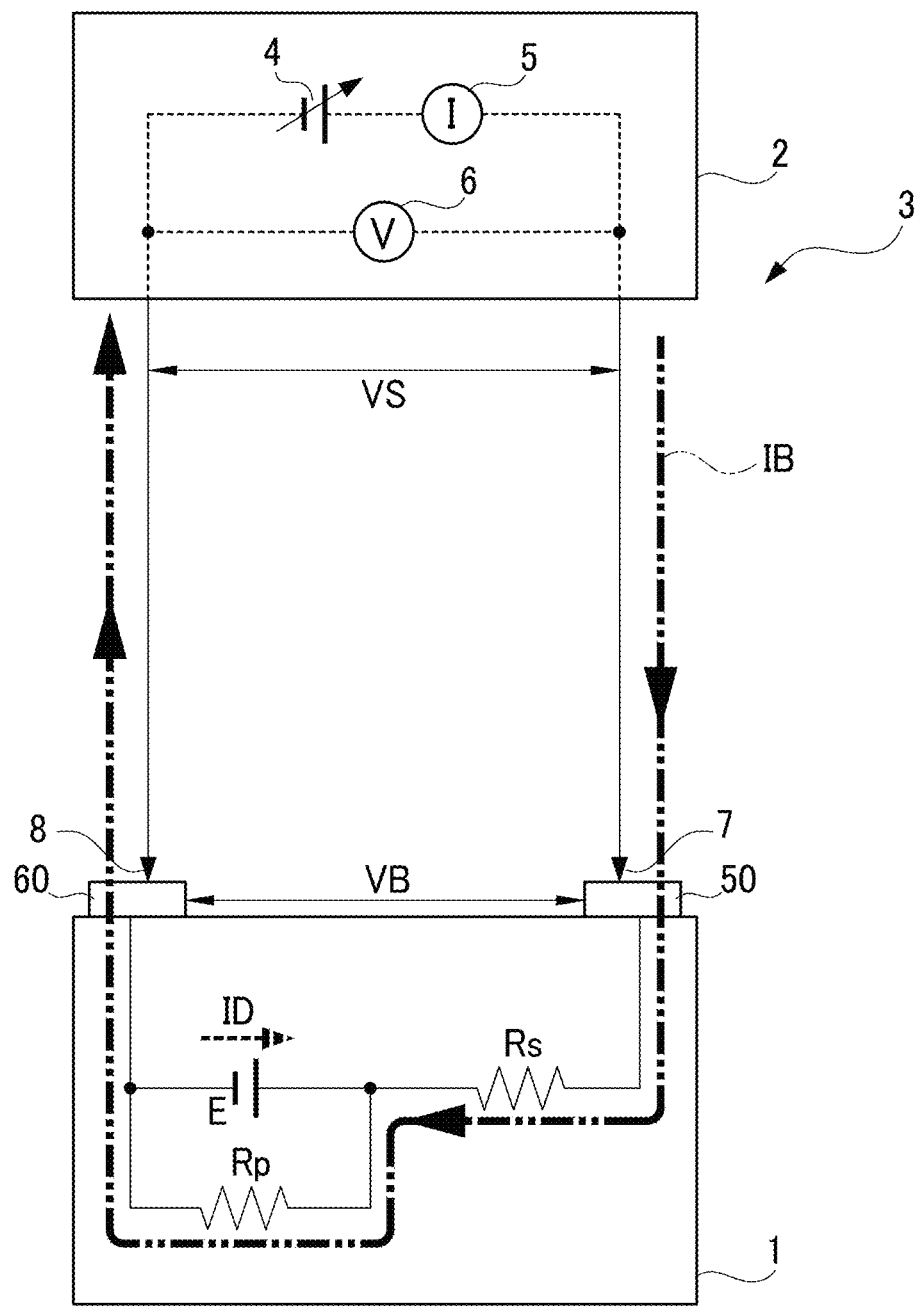
FIG. 1 is a configuration diagram of a circuit assembled to perform an inspection method for a secondary battery in an embodiment.

In FIG. 1, the secondary battery 1 is schematically illustrated. This secondary battery 1 in FIG. 1 is illustrated as a model configured with an electromotive element E, an internal resistance Rs, and a short-circuit resistance Rp. The internal resistance Rs is placed in series with the electromotive element E. The short-circuit resistance Rp models an electric conduction path provided by a minute metal foreign substance(s) which may have intruded in the electrode laminated body 20. This short-circuit resistance Rp is placed in parallel with the electromotive element E.

The measuring device 2 includes a direct-current (DC) power supply 4, an ammeter 5, a voltmeter 6, and probes 7 and 8. The ammeter 5 is placed in series with the DC power supply 4, while the voltmeter 6 is placed in parallel with the DC power supply 4. The DC power supply 4 has a variable output voltage VS, namely, a power supply voltage. The DC power supply 4 is used to apply the output voltage VS to the secondary battery 1. The ammeter 5 measures a current that flows through the circuit 3. The voltmeter 6 measures a voltage between the probes 7 and 8. In the present embodiment, as shown in FIG. 1, the probes 7 and 8 of the measuring device 2 are respectively connected to the terminals 50 and 60 of the secondary battery 1 to constitute the circuit 3.

In the inspection method in the present embodiment, the amount of self-discharge of the secondary battery 1 is inspected. When the self-discharge amount is large, the secondary battery 1 is a defective product, whereas when the self-discharge amount is small, the secondary battery 1 is a non-defective product. For this inspection, the secondary battery 1 is charged first in advance of connection to the measuring device 2. Further, the secondary battery 1 after charged is connected to the measuring device 2 to constitute the circuit 3. Then, the current flowing through the circuit 3, referred to as a circuit current IB, is measured by the measuring device 2. Based on a value of the circuit current IB that has converged, i.e., after convergence, (referred to as a converged circuit current IBs), the quality of the secondary battery 1 is determined, in other words, whether the secondary battery 1 is defective or non-defective is determined.

Specifically, the secondary battery 1 that has been charged, i.e., the charged secondary battery 1, to be inspected is prepared first. This charged secondary battery 1 is a secondary battery that also has undergone a high-temperature aging performed after charging and its battery voltage has been stabilized. The inspection in the present embodiment is performed for example in an inspection room with a room temperature controlled by an air conditioner whose set temperature is set at a predetermined temperature (e.g., 20° C.). In this inspection room, the battery voltage VB of the secondary battery 1 to be inspected (that has been subjected to the charging and the high-temperature aging) is measured. This value is an initial battery voltage VB1.

Next, the output voltage VS of the measuring device 2 (the DC power supply 4) is adjusted to coincide with the initial battery voltage VB1. Subsequently, in a circuit constitution process (the constituting of the present disclosure), as shown in FIG. 1, the target secondary battery 1 for inspection and the measuring device 2 including the DC power supply 4 that is equal in voltage to the initial battery voltage VB1 of the secondary battery 1 are connected to each other so that the output voltage VS is opposite in direction to the battery voltage VB of the secondary battery 1 to constitute the circuit 3. At this time, the output voltage VS of the DC power supply 4 coincides with the initial battery voltage VB1 of the secondary battery 1. In this state, the output voltage VS coincides with the initial battery voltage VB1 and also the output voltage VS and the battery voltage VB of the secondary battery 1 are opposite in direction. Thus, both the voltages negate each other, with the result that the circuit current IB of the circuit 3 becomes zero.

However, the battery voltage VB gradually decreases from the initial battery voltage VB1 in association with the self-discharge of the secondary battery 1. This disrupts the balance between the output voltage VS and the battery voltage VB, that is, generates a voltage difference between the output voltage VS and the battery voltage VB, thereby causing the circuit current IB to flow through the circuit 3. In the present embodiment, therefore, the circuit 3 is constituted in the circuit constitution process and also a current measurement process (the measuring of the present disclosure) is started to measure a value of the circuit current IB at regular time intervals. The value of the circuit current IB gradually increases from zero. The circuit current IB is directly measured by the ammeter 5. Eventually, the battery voltage VB and the circuit current IB converge, and thereafter, both the battery voltage VB and the circuit current IB become substantially constant. In the current measurement process, accordingly, a value of the converged circuit current IBs is obtained.

In a determination process (the determining of the present disclosure), subsequently, it is determined whether the secondary battery 1 is defective or non-defective based on the value of the converged circuit current IBs measured in the current measurement process. Specifically, the quality of the secondary battery 1 is determined based on the value of the converged circuit current IBs obtained in the current measurement process. The details thereof will be described below. A defective secondary battery 1 (large in self-discharge amount) exhibits that an increase of the circuit current IB and a decrease of the battery voltage VB are both steeper as compared with a non-defective secondary battery 1 (small in self-discharge amount). Accordingly, a converged circuit current IBs flowing through the defective secondary battery 1 is larger than a converged circuit current IBs flowing through the non-defective secondary battery 1.

Further, a converged battery voltage VB2 of the defective secondary battery 1 is lower than a converged battery voltage VB2 of the non-defective secondary battery 1.

The reason for the above results will be explained below. The battery voltage VB decreases because of the self-discharge of the secondary battery 1 as described above. Due to the self-discharge, a self-discharge current ID flows through the electromotive element E of the secondary battery 1. The self-discharge current ID is larger as the self-discharge amount of the secondary battery 1 is larger, while the self-discharge current ID is smaller as the self-discharge amount of the secondary battery 1 is smaller. The secondary battery 1 in which the aforementioned short-circuit resistance Rp has a smaller value tends to be larger in self-discharge current ID.

In contrast, the circuit current IB caused to flow by a decrease of the battery voltage VB is a current flowing in a direction of charging the secondary battery 1. That is, the circuit current IB acts in the direction of suppressing the self-discharge of the secondary battery 1 and passes in the direction opposite to the self-discharge current ID within the secondary battery 1. When the circuit current IB increases to the same level as the self-discharge current ID, the self-discharge substantially stops. Consequently, after that, both the battery voltage VB and the circuit current IB are constant (VB2, IBs). Whether or not the circuit current IB has converged may be determined by a known method. One example of this method may be configured such that the value of the circuit current IB is obtained at regular time intervals in the current measurement process, and when a change amount of the value of the circuit current IB is smaller than a preset reference change amount, the circuit current IB is determined to have converged.

Herein, the circuit current IB can directly obtained as a reading value of the ammeter 5. Accordingly, the quality of the secondary battery 1 can be determined by setting a threshold IK for the converged circuit current IBs. When the converged circuit current IBs is larger than the threshold IK, the target secondary battery 1 for inspection is determined to be defective with a large self-discharge amount. When the circuit current IBs is the threshold IK or less, the target secondary battery 1 is determined to be non-defective with a small self-discharge amount.

Meanwhile, in a conventional inspection method, the temperature of the target secondary battery for inspection would fluctuate as the room temperature of the inspection room fluctuates. Specifically, even when the inspection is performed in the inspection room with the room temperature controlled by an air conditioner whose set temperature is set at a predetermined temperature (e.g., 20° C.), it is difficult to keep the room temperature constant and thus the room temperature continuously fluctuates during the inspection period. Therefore, the temperature of the target secondary battery 1 also fluctuates with the fluctuations in the room temperature of the inspection room during execution of the inspection.

While the current measurement process is being performed, therefore, the battery voltage VB may fluctuate because of the fluctuations in the battery temperature, that is, the battery voltage VB may fluctuate because of a different factor from the self-discharge of the secondary battery 1, so that the circuit current IB is caused to fluctuate. Thus, the circuit current IB is less likely to converge and thus the quality of the secondary battery 1 cannot be appropriately determined.

Figure 3:
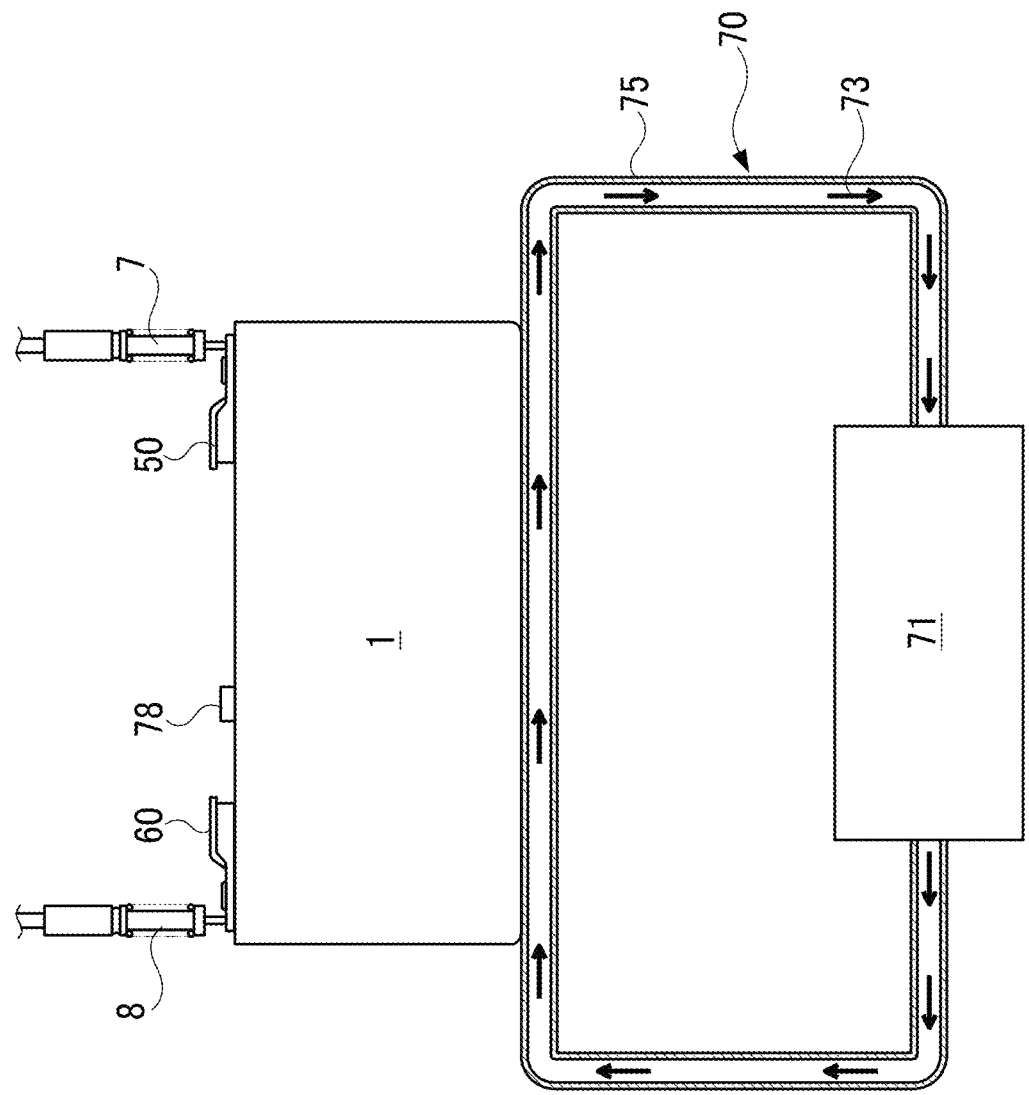
FIG. 3 is an explanatory view of the inspection method for a secondary battery in the embodiment.

In contrast, in the inspection method in the present embodiment, during execution of the current measurement process, that is, during a period from when the circuit 3 is constituted to when the value of converged circuit current IBs is obtained, the battery temperature control is performed to control the temperature of the secondary battery 1. Specifically, as shown in FIG. 3, a battery temperature controller 70 provided to the secondary battery 1 is operated to control the temperature of the secondary battery 1 (i.e., the battery temperature) so that the temperature of the secondary battery 1 becomes a target temperature Tm. The battery temperature controller 70 is provided with a chiller 71 for controlling the temperature of a thermal medium 73 (e.g., water), a circulation pipe 75 through which the thermal medium 73 flows at the temperature controlled by the chiller 71, and a thermistor 78 for measuring the temperature of the secondary battery 1. The thermistor 78 is connected to a control unit (not shown) of the chiller 71 by a wiring not shown.

As shown in FIG. 3, a part of the circulation pipe 75 is in contact with the secondary battery 1, so that heat exchange takes place between the secondary battery 1 and the thermal medium 73, thereby bringing the temperature of the secondary battery 1 close to the temperature of the thermal medium 73 flowing through the circulation pipe 75. Specifically, while the current measurement process is being performed, the temperature of the secondary battery 1 is measured by the thermistor 78 at regular time intervals, and the temperature of the thermal medium 73 is controlled by the chiller 71 so that the measured temperature of the secondary battery 1 becomes the target temperature Tm.

The above manner can reduce the battery temperature fluctuations during execution of the current measurement process. Specifically, the battery temperature can be kept at the target temperature Tm or a temperature close thereto, for example, within a range of the target temperature Tm±0.1° C. Accordingly, the fluctuations in the battery voltage VB caused by the battery temperature fluctuations, that is, the fluctuations in the battery voltage VB caused by a different factor from the self-discharge of the secondary battery 1, can be reduced, and hence the fluctuations in the circuit current IB caused by the battery temperature fluctuations can be reduced.

This makes it easy for the circuit current IB to converge, so that the quality of the secondary battery 1 can be appropriately determined. Specifically, the circuit current IB can quickly converge, that is, the converged circuit current IBs can be promptly obtained. Thus, the quality of the secondary battery 1 can be determined promptly in the determination process. The target temperature Tm may include for example a room temperature (an actual measured value) of the inspection room obtained when the circuit 3 is constituted in the circuit constitution process.

Example 1

Figure 4:
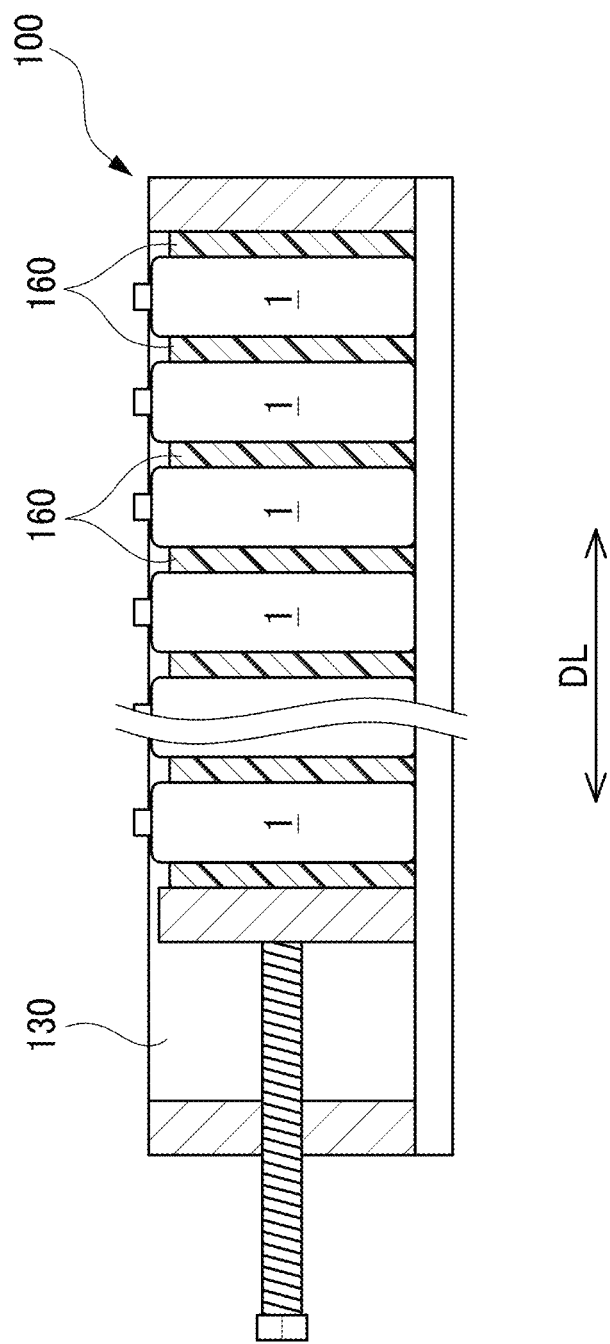
FIG. 4 is a schematic diagram of a battery stack in Example 1.

In Example 1, firstly, eight secondary batteries 1 are arranged in a row in an arrangement direction DL (a horizontal direction in FIG. 4) and restrained with a restraining jig 130 to provide a battery stack 100 with the eight secondary batteries 1 restrained (see FIG. 4). Herein, those eight secondary batteries 1 included in the battery stack 100 are numbered 1 to 8 in the order from a right end to a left end in FIG. 4. Further, plastic spacers 160 are each interposed between adjacent two of the secondary batteries 1 in the arrangement direction DL. Thereafter, each of the secondary batteries 1 of the battery stack 100 is charged and discharged to adjust a state of charge (SOC) to 90% SOC. In this way, each secondary battery 1 of the battery stack 100 is brought into a charged state, i.e., a charged secondary battery 1. This battery stack 100 is left to rest for 6 hours in a constant temperature room with a setting temperature of 63° C. to subject the secondary batteries 1 of the battery stack 100 to a high-temperature aging. Thereafter, each secondary battery 1 of the battery stack 100 is cooled to 19.5° C.

Subsequently, the secondary batteries 1 of the battery stack 100 are individually subjected to the above-described inspection. Specifically, the battery stack 100 is placed in the inspection room with the room temperature controlled by an air conditioner whose set temperature is set at 19.5° C. More specifically, the above-described battery temperature controllers 70 (see FIG. 3) are each provided for one of the eight secondary batteries 1 of the battery stack 100, and the battery stack 100 is placed in the inspection room. Then, in the circuit constitution process, the eight secondary batteries 1 of the battery stack 100 are each connected to one of the measuring devices 2 each including a DC power supply 4 to constitute eight circuits 3 (see FIG. 1). Furthermore, in the current measurement process, the circuit current IB in each of the eight circuits 3 is measured at regular time intervals.

Furthermore, at the same time as the start of the current measurement process, the battery temperature control is started. Specifically, the temperatures of the eight secondary batteries 1 are individually controlled by corresponding eight battery temperature controllers 70 so that the temperature of each secondary battery 1 (each battery temperature) becomes the target temperature Tm (see FIG. 3). In Example 1, the target temperature Tm is set to an actual measured value of the room temperature of the inspection room (specifically, 19.5° C.) obtained when each of the circuits 3 is constituted. In Example 1, as described above, the battery temperature of each of the eight secondary batteries 1 of the battery stack 100 is controlled during execution of the current measurement process for each circuit 3.

Figure 5:
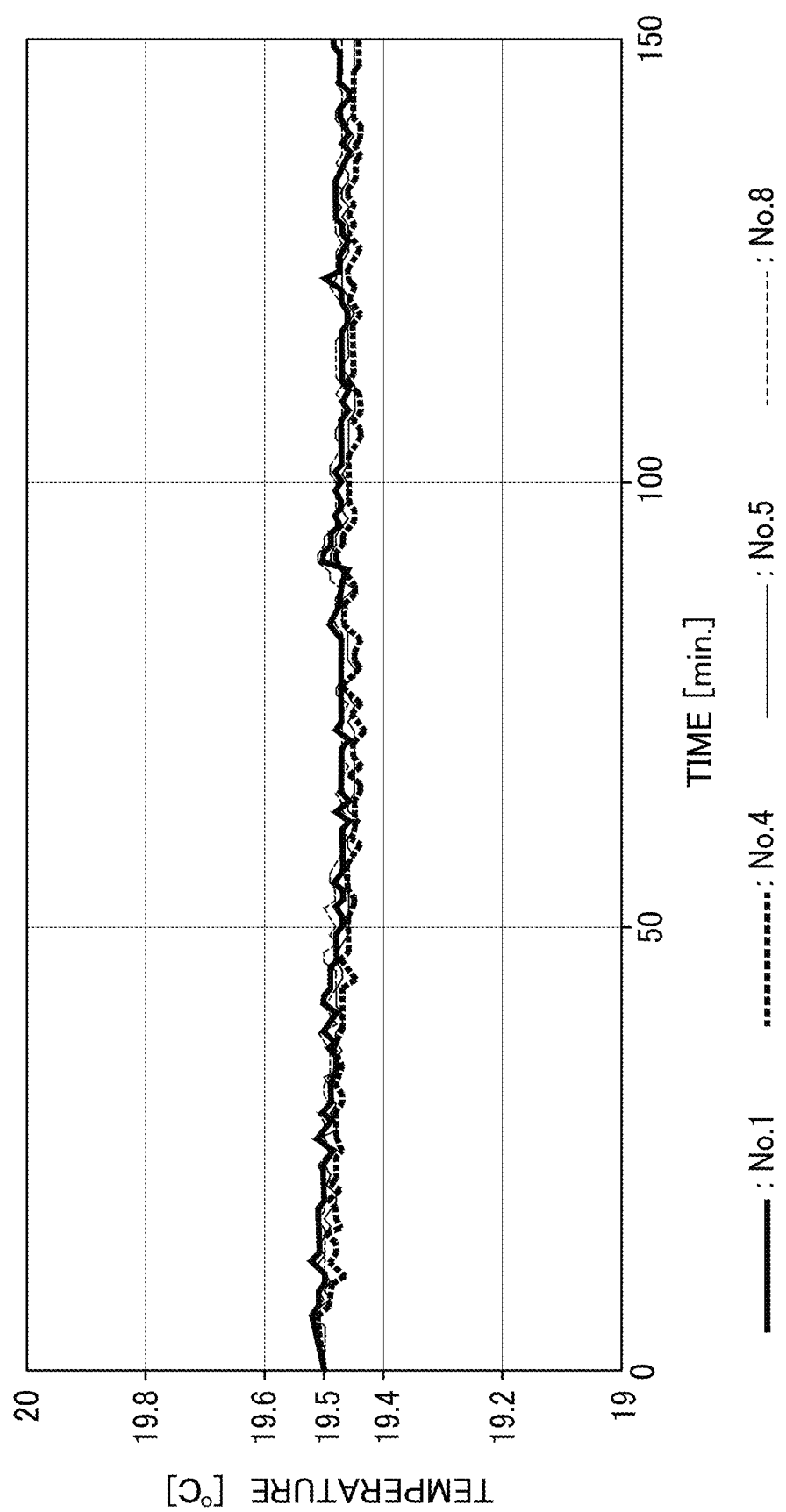
FIG. 5 is a graph showing battery temperature fluctuations in Example 1.

Herein, FIG. 5 shows the fluctuations in battery temperature (i.e., the transition of battery temperature during execution of the current measurement process) in Example 1. FIG. 5 plots temperature fluctuations in four of the eight secondary batteries 1 included in the battery stack 100. These four secondary batteries 1 includes a rightmost secondary battery 1 in FIG. 4 (No. 1 plotted with a thick line in FIG. 5), a fourth secondary battery 1 from the right in FIG. 4 (No. 4 plotted with a thick broken line in FIG. 5), a fifth secondary battery 1 from the right in FIG. 4 (No. 5 plotted with a thin line in FIG. 5), and a leftmost secondary battery 1 in FIG. 4 (No. 8 plotted with a thin broken line in FIG. 5).

In Example 1, as shown in FIG. 5, while the current measurement process is being performed, the battery temperature of each secondary battery 1 of the battery stack 100 can be maintained at the target temperature Tm (concretely, 19.5° C.) or a temperature close thereto (concretely, within a range of the target temperature Tm±0.1° C.). FIG. 5 shows the temperature fluctuations in only four secondary batteries (Nos. 1, 4, 5, and 8) among the eight secondary batteries 1 of the battery stack 100, but the temperature fluctuations of remaining four secondary batteries 1 exhibit the same behaviors as above. In Example 1, specifically, during execution of the current measurement process, the temperature fluctuations of each secondary battery 1 of the battery stack 100 could fall within a range of 0.1° C.

In Example 1, accordingly, each secondary battery 1 of the battery stack 100 can be reduced in fluctuations in the battery voltage VB due to the battery temperature fluctuations, that is, reduced in fluctuations in the battery voltage VB due to a different factor from the self-discharge of each secondary battery 1. Thus, the fluctuations in the circuit current IB due to the battery temperature fluctuations can be reduced. Consequently, the circuit current IB in each secondary battery 1 of the battery stack 100 can easily converge, so that the quality of each secondary battery 1 can be appropriately determined. To be specific, the circuit current IB in each secondary battery 1 of the battery stack 100 can quickly converge, so that the quality of each secondary battery 1 can be promptly determined in the determination.

Figure 6:
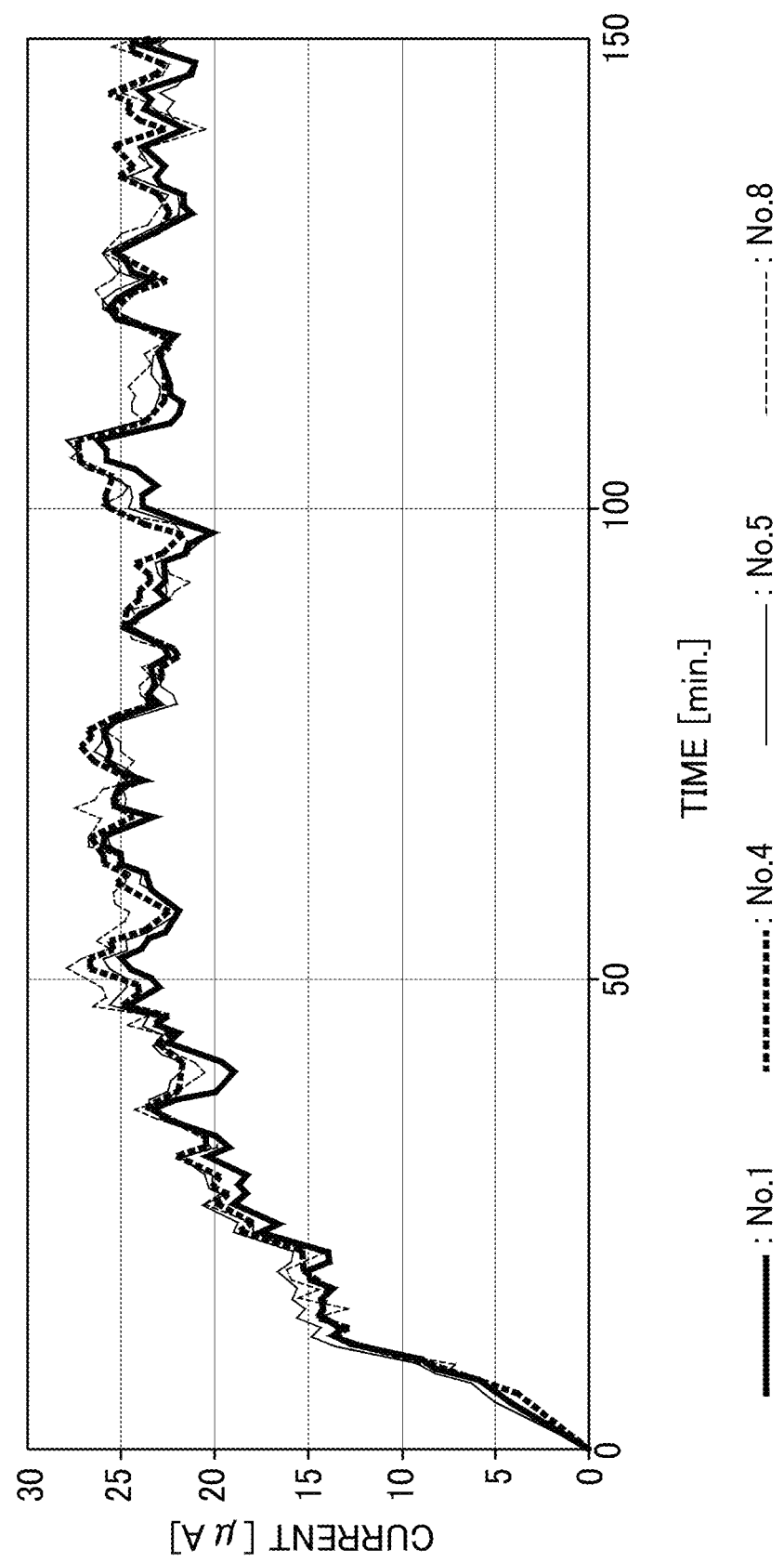
FIG. 6 is a graph showing transition of a circuit current in Example 1.

Herein, FIG. 6 shows the transition of the circuit current IB (that is, the measured values of circuit current IB obtained in the current measurement process) in Example 1. FIG. 6 plots the transition of each circuit current IB of only four secondary batteries 1 (Nos. 1, 4, 5, and 8) among the eight secondary batteries 1 included in the battery stack 100, but the remaining four secondary batteries 1 also exhibit the same transition as above. In Example 1, as shown in FIG. 6, the circuit current IB can converge in the circuit 3 of each secondary battery 1 of the battery stack 100 at the time when 150 minutes have passed from the start of the current measurement process. In Example 1, as described above, the circuit current IB of each secondary battery 1 of the battery stack 100 could quickly converge.

Comparative Example 1

Figure 7:
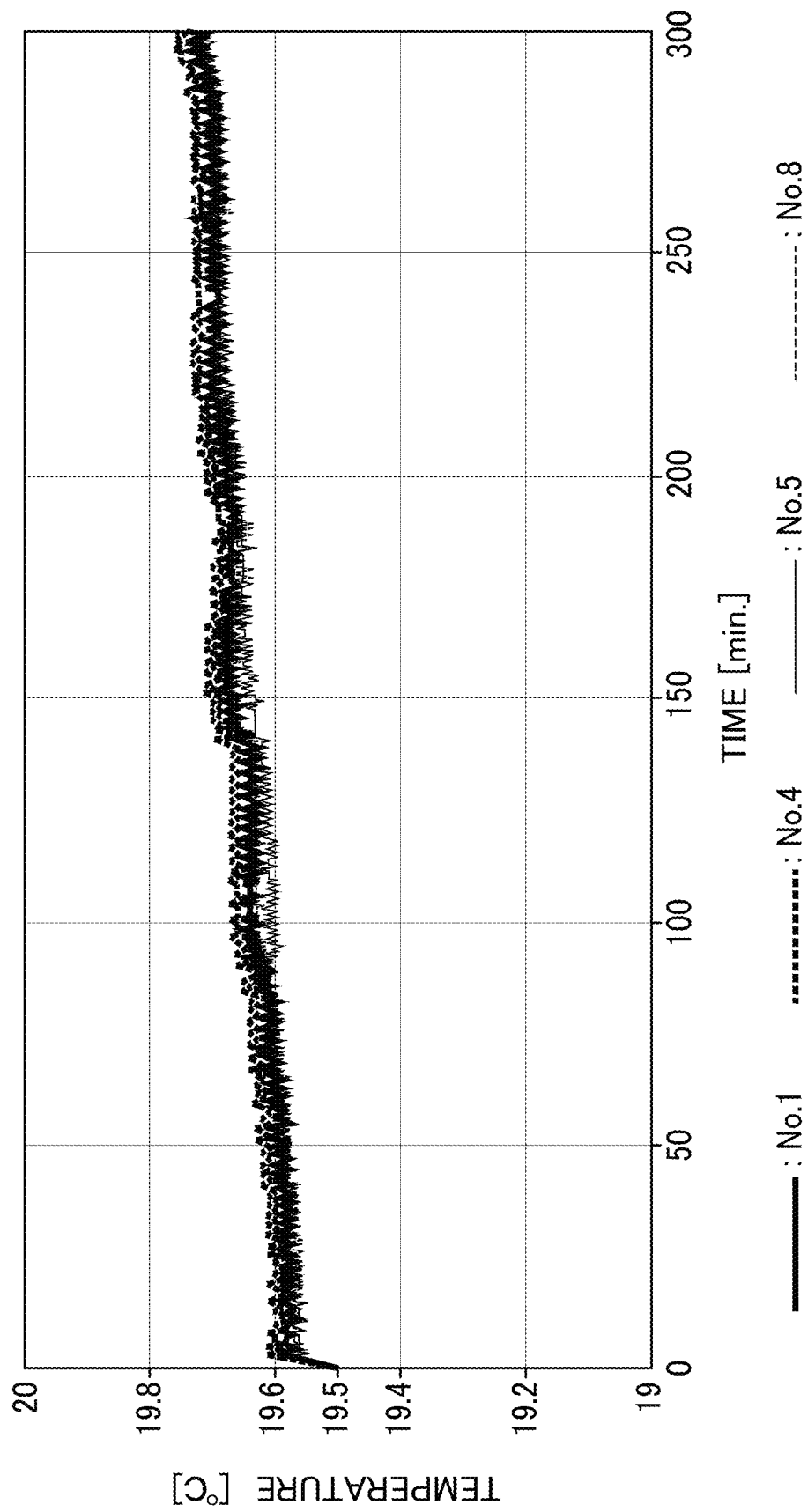
FIG. 7 is a graph showing battery temperature fluctuations in Comparative example 1.

In Comparative example 1, differently from Example 1, eight secondary batteries 1 included in the battery stack 100 are subjected to an inspection without undergoing the battery temperature control using the battery temperature controller 70. Comparative example 1 differs only in this regard from Example 1. Herein, FIG. 7 shows the fluctuations in battery temperature (i.e., the transition of battery temperature during execution of the current measurement process) in Comparative example 1. FIG. 7 plots the temperature fluctuations in four secondary batteries 1 (Nos. 1, 4, 5, and 8) among the eight secondary batteries 1 of the battery stack 100, but the remaining four secondary batteries 1 exhibit the same temperature fluctuations as above.

In Comparative example 1, as shown in FIG. 7, the temperature fluctuations in each secondary battery 1 of the battery stack 100 are larger than those in Example 1. Specifically, in Comparative example 1, the inspection was performed in the inspection room with a room temperature controlled by an air conditioner whose set temperature was set at 19.5° C. However, it is difficult to keep the room temperature constant and thus the room temperature continuously fluctuates during the inspection. While the current measurement process is being executed, therefore, the temperature of each secondary battery 1 of the battery stack 100 fluctuated with the fluctuations in room temperature of the inspection room. In Comparative example 1, concretely, during execution of the current measurement process, the temperature fluctuations in each secondary battery 1 of the battery stack 100 fallen within a range of about 0.2° C.

In Comparative example, accordingly, the battery voltage VB fluctuates because of the battery temperature fluctuations, that is, the battery voltage VB fluctuates because of a different factor from the self-discharge of respective secondary batteries 1. Thus, the circuit current IB of each secondary battery 1 greatly fluctuated (see FIG. 8). Consequently, each circuit current IB is hard to converge, so that the quality of each secondary battery 1 could not be determined appropriately.

Figure 8:
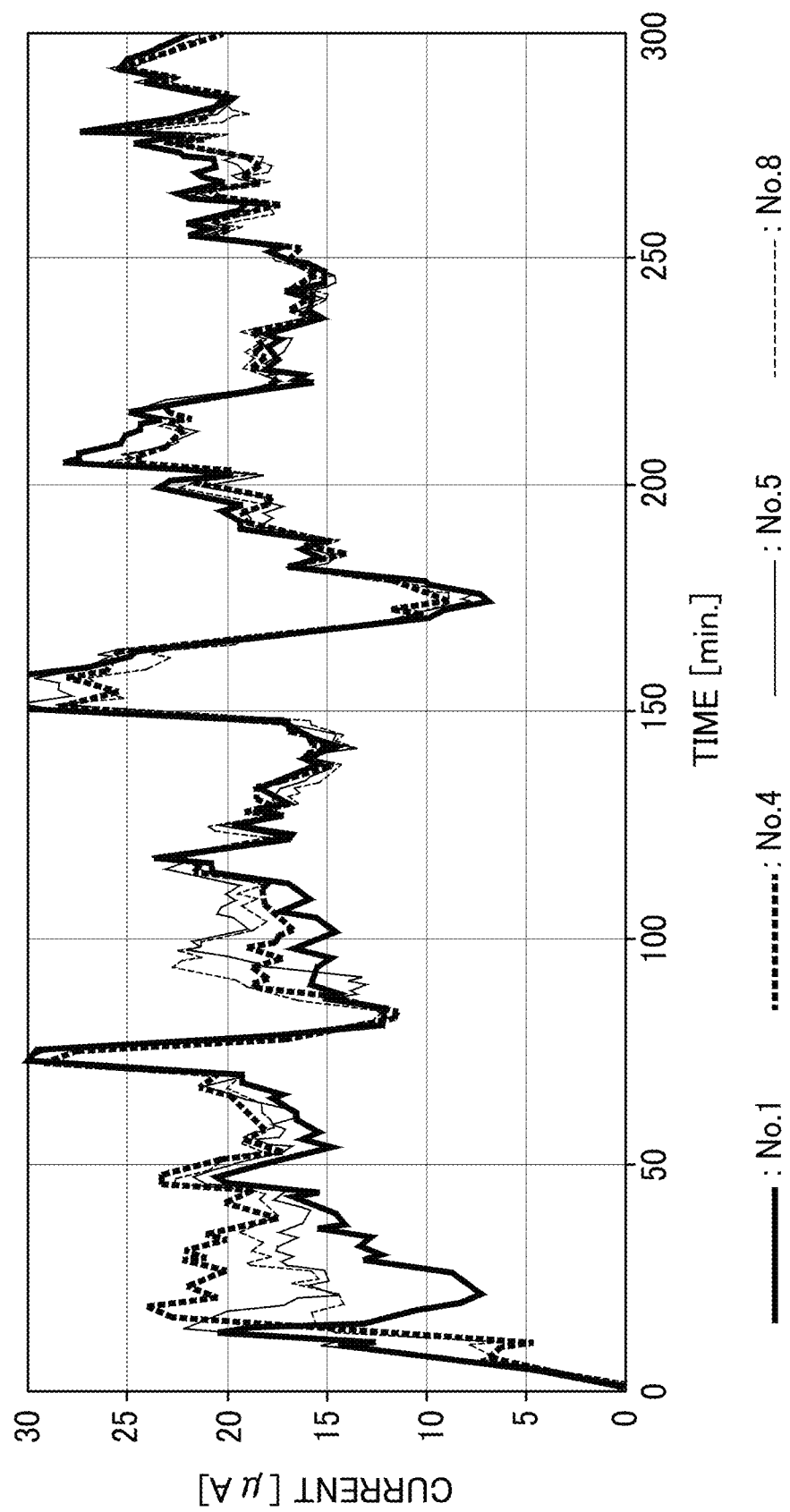
FIG. 8 is a graph showing transition of a circuit current in Comparative example 1.

Herein, FIG. 8 shows the transition of the circuit current IB (that is, the measured values of circuit current IB obtained in the current measurement process) in Comparative example 1. FIG. 8 plots the transition of each circuit current IB of only four secondary batteries 1 (Nos. 1, 4, 5, and 8) among the eight secondary batteries 1 included in the battery stack 100, but the remaining four secondary batteries 1 also exhibit the same transition as above. In Comparative example 1, as shown in FIG. 8, even after 300 minutes has passed from the start of the current measurement process, the circuit current IB did not converge in each of the secondary batteries 1 of the battery stack 100. In Comparative example 1, therefore, even after a lapse of 300 minutes from the start of the current measurement process, the quality of each secondary battery 1 of the battery stack 100 could not be determined.

The foregoing embodiments are mere examples and give no limitation to the present disclosure. The present disclosure may be embodied in other specific forms without departing from the essential characteristics thereof.

For instance, in the foregoing embodiment, the battery temperature controller 70 provided with the chiller 71 and the circulation pipe 75 is used as a device for controlling the temperature of the corresponding secondary battery 1. However, this device for controlling the temperature of a secondary battery 1 is not limited to the battery temperature controller 70 and may be any devices configured to control the temperature of a secondary battery 1.

In Example 1, the target temperature Tm is set equal for all the secondary batteries 1 constituting the battery stack 100. As an alternative, the target temperature Tm may be set different between some or all of the secondary batteries 1 of the battery stack 100.

In Example 1, the battery stack 100 constituted of eight secondary batteries 1 is exemplified as a battery stack. As an alternative, the inspection method of the present disclosure may be applied to any other battery stack irrespective of the number of secondary batteries constituting the battery stack. To be specific, the number of secondary batteries which are subjected to the inspection method of the present disclosure may be any number.

REFERENCE SIGNS LIST

1 Secondary battery
2 Measuring device
3 Circuit
4 DC power supply (Power supply)
5 Ammeter
6 Voltmeter
7, 8 Probe
70 Battery temperature controller
71 Chiller
75 Circulation pipe
78 Thermistor
100 Battery stack
130 Restraining jig
IB Circuit current
VB Battery voltage
VS Output voltage (Power supply voltage)

What is claimed is:

1. A method for inspecting a secondary battery, wherein a circuit is constituted by connection of a power supply to the secondary battery to be inspected, and a quality of the secondary battery is determined based on a circuit current that flows through the circuit, the method comprising:
   constituting the circuit by connecting the power supply to the secondary battery that has been charged;
   measuring the circuit current that flows through the circuit in association with self-discharge of the secondary battery; and
   determining the quality of the secondary battery based on a value of the circuit current after convergence that is measured in the measuring,
   wherein during execution of the measuring, a battery temperature control is performed using a battery temperature controller controlling a heat exchanger in contact with the secondary battery, to control a temperature of the secondary battery.

2. The method for inspecting a secondary battery according to claim 1, wherein the battery temperature control includes controlling the temperature of the secondary battery so that the temperature of the secondary battery becomes a target temperature.

3. The method for inspecting a secondary battery according to claim 1,
   wherein the secondary battery to be inspected comprises a plurality of secondary batteries included in a battery stack in which the secondary batteries are arranged in a row and restrained in an arrangement direction, and the power supply comprises a plurality of power supplies,
   the constituting includes connecting each of the power supplies to one of the secondary batteries to constitute a plurality of the circuits,
   the measuring includes measuring the circuit current that flows through each of the circuits,
   the determining includes determining the quality of each of the secondary batteries based on a value of the circuit current after convergence, and
   the battery temperature control includes controlling the temperature of each of the secondary batteries so that the temperature of each secondary battery becomes the target temperature.

4. The method for inspecting a secondary battery according to claim 2,
   wherein the secondary battery to be inspected comprises a plurality of secondary batteries included in a battery stack in which the secondary batteries are arranged in a row and restrained in an arrangement direction, and the power supply comprises a plurality of power supplies,
   the constituting includes connecting each of the power supplies to one of the secondary batteries to constitute a plurality of the circuits,
   the measuring includes measuring the circuit current that flows through each of the circuits,
   the determining includes determining the quality of each of the secondary batteries based on a value of the circuit current after convergence, and
   the battery temperature control includes controlling the temperature of each of the secondary batteries so that the temperature of each secondary battery becomes the target temperature.

* * * * *